US009608129B1

(12) United States Patent
Chang et al.

(10) Patent No.: US 9,608,129 B1
(45) Date of Patent: Mar. 28, 2017

(54) SEMICONDUCTOR DEVICE AND ZENER DIODE HAVING BRANCH IMPURITY REGIONS

(71) Applicant: Macronix International Co., Ltd., Hsinchu (TW)

(72) Inventors: Yu-Jui Chang, Hsinchu (TW); Cheng-Chi Lin, Toucheng Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/882,997

(22) Filed: Oct. 14, 2015

(51) Int. Cl.
*H01L 29/861* (2006.01)
*H01L 29/866* (2006.01)
*H01L 29/66* (2006.01)
*H01L 29/06* (2006.01)

(52) U.S. Cl.
CPC ........ *H01L 29/866* (2013.01); *H01L 29/0688* (2013.01); *H01L 29/66106* (2013.01)

(58) Field of Classification Search
CPC ............... H01L 29/866; H01L 29/0688; H01L 29/66106
See application file for complete search history.

(56) References Cited

U.S. PATENT DOCUMENTS 5,081,514 A * 1/1992 Ueoka ................. H01L 27/0203
257/355
2015/0364461 A1* 12/2015 Kato .................... H01L 27/0814
257/499
2016/0197095 A1* 7/2016 Yamane .................... G05F 1/56
257/506

* cited by examiner

*Primary Examiner* — Victor A Mandala
(74) *Attorney, Agent, or Firm* — Finnegan, Henderson, Farabow, Garrett & Dunner LLP

(57) ABSTRACT

A semiconductor device includes a substrate, a well region of a first-conductivity type disposed in the substrate, a first impurity region of a second-conductivity type and having a plurality of branches disposed in the well region, a second impurity region of the first-conductivity type and having a plurality of branches, and a third impurity region of the first-conductivity type disposed in the well region. The second-conductivity type is opposite to the first-conductivity type. A portion of the first impurity region overlaps a portion of the third impurity region. The plurality of branches of the second impurity region are disposed in the third impurity region, and a portion of the third impurity region is disposed between the first impurity region and the second impurity region.

18 Claims, 9 Drawing Sheets

(Prior Art)

SEMICONDUCTOR DEVICE AND ZENER DIODE HAVING BRANCH IMPURITY REGIONS

FIELD

Example embodiments relate to a semiconductor device and, more particularly, to a semiconductor device including a Zener diode having branch impurity regions.

BACKGROUND

In general, a Zener diode operates with a reverse bias when it is applied in a circuit. When a reverse bias voltage applied to a Zener diode exceeds a certain value, the current flowing through the diode rises rapidly due to the electron tunneling effect. This reverse voltage is referred to as the Zener breakdown voltage. The current flow in the forward direction of a Zener diode is similar to that of a traditional diode.

The basic structure of a Zener diode includes a p-n junction. The Zener breakdown voltage can be adjusted by selecting an appropriate doping material and concentration. Conventional Zener diodes include doping areas that have the shape of a rectangle. FIG. 1A shows a plan view of a conventional n-type base Zener diode 100. FIG. 1B shows a cross-sectional view along a section line AA illustrated in FIG. 1A. Zener diode 100 is formed in an n-type well region (N-Well or NW) 102 of a semiconductor substrate 104, and includes a p+ doped region 106, at least one n+ doped region 108, and at least one n-type base region (NBASE) 110. An anode 112 of diode 100 is coupled to p+ doped region 106, and at least one cathode electrode 114 is coupled to n+ doped region 108.

FIG. 2A shows a plan view of a conventional p-type base Zener diode 200. FIG. 2B shows a cross-sectional view along a section line AN as illustrated in FIG. 2A. Zener diode 200 is formed in a p-type well region (P-Well or PW) 202 of a semiconductor substrate 204 and includes an n+ doped region 206, at least one p+ doped region 208, and at least one p-type base region (PBASE) 210. A cathode 212 of diode 200 is coupled to n+ doped region 206, and at least one anode electrode 214 is coupled to p+ doped region 208.

As shown in FIGS. 1A, 1B, 2A, and 2B, conventional Zener diodes have doped regions, such as regions 106, 108, 206, and 208, in the shape of a rectangle. It has been proposed to increase the switching speed of Zener diodes so as to meet the demand for higher performance and to avoid circuit failure due to the slow switching behavior of the conventional Zener diodes.

SUMMARY OF EMBODIMENTS

According to a first aspect of the present disclosure, there is provided a semiconductor device. The semiconductor device includes a substrate, a well region of a first-conductivity type disposed in the substrate, a first impurity region of a second-conductivity type and having a plurality of branches disposed in the well region, a second impurity region of the first-conductivity type and having a plurality of branches, and a third impurity region of the first-conductivity type disposed in the well region. The second-conductivity type is opposite to the first-conductivity type. A portion of the first impurity region overlaps a portion of the third impurity region. The plurality of branches of the second impurity region is disposed in the third impurity region, and a portion of the third impurity region is disposed between the first impurity region and the second impurity region.

According to a second aspect of the present disclosure, there is provided a semiconductor device. The semiconductor device includes a substrate, a well region of a first-conductivity type disposed in the substrate, a first impurity region of a second-conductivity type, a second impurity region of the first-conductivity type, and a third impurity region of the first-conductivity type disposed in the well region. The first impurity region has a first branch extending in a first direction and a plurality of second branches extending in a second direction and connected to the first branch. The second impurity region has a third branch extending substantially in first direction and a plurality of fourth branches extending substantially in the second direction and connected with the third branch. The second-conductivity type is opposite to the first-conductivity type. A portion of the first impurity region overlaps a portion of the third impurity region. The second impurity region is disposed in the third impurity region, and a portion of the third impurity region is disposed between the first impurity region and the second impurity region.

According to a third aspect of the present disclosure, there is provided a method for manufacturing a semiconductor device. The method includes forming a well region of the first-conductivity type in a substrate, forming a third impurity region of the first-conductivity type in the well region, forming a first impurity region of a second-conductivity type in the well region and having a plurality of branches, and forming a second impurity region of the first-conductivity type in the third impurity region and having a plurality of branches. The second-conductivity type is opposite to the first-conductivity type. A portion of the first impurity region is formed to overlap a portion of the third impurity region. A portion of the third impurity region is disposed between the first impurity region and the second impurity region.

BRIEF DESCRIPTION OF THE DRAWINGS

Reference will now be made, by way of example, to the accompanying drawings which show example embodiments of the present application, and in which.

DESCRIPTION OF EMBODIMENTS

Hereinafter, embodiments consistent with the disclosure will be described with reference to the drawings. Wherever possible, the same reference numbers will be used throughout the drawings to refer to the same or like parts.

Figure 1A:
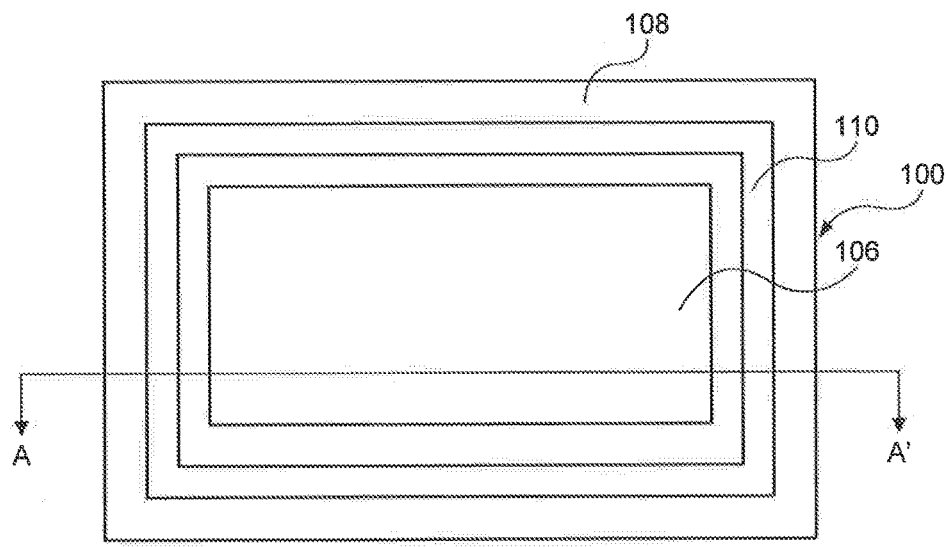
FIG. 1A shows a plan view of a conventional Zener diode.
Figure 1B:
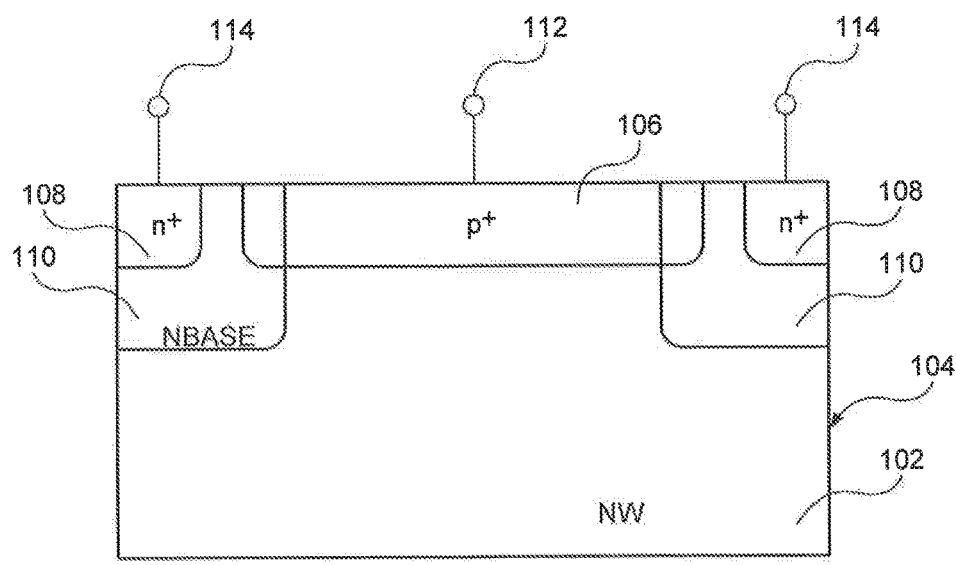
FIG. 1B shows a cross-sectional view along section line AA' in FIG. 1A.
Figure 2A:
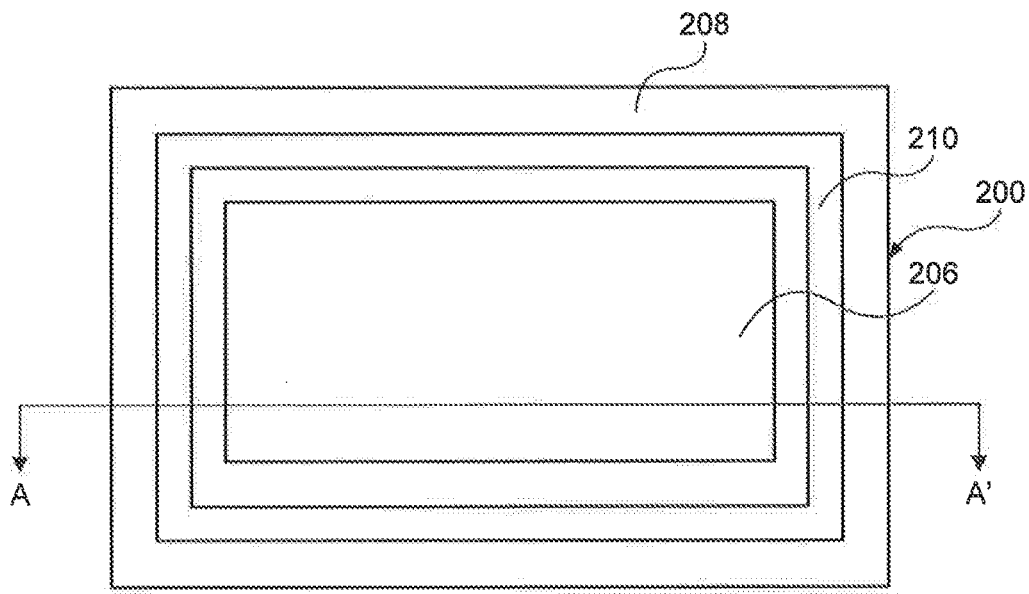
FIG. 2A shows a plan view of a conventional Zener diode.
Figure 2B:
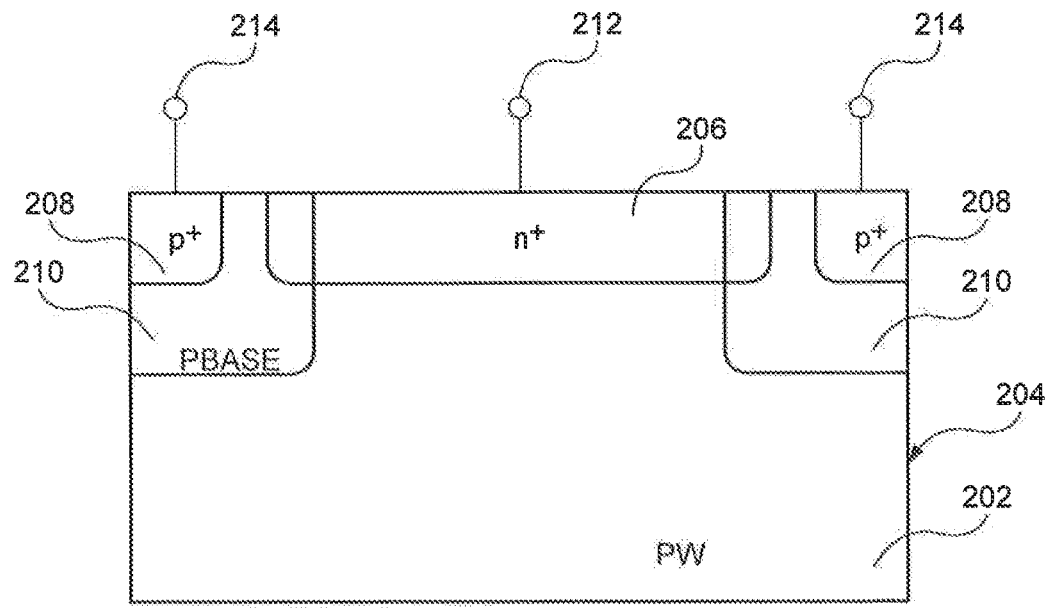
FIG. 2B shows a cross-sectional view along section line AA in FIG. 2A.
Figure 3A:
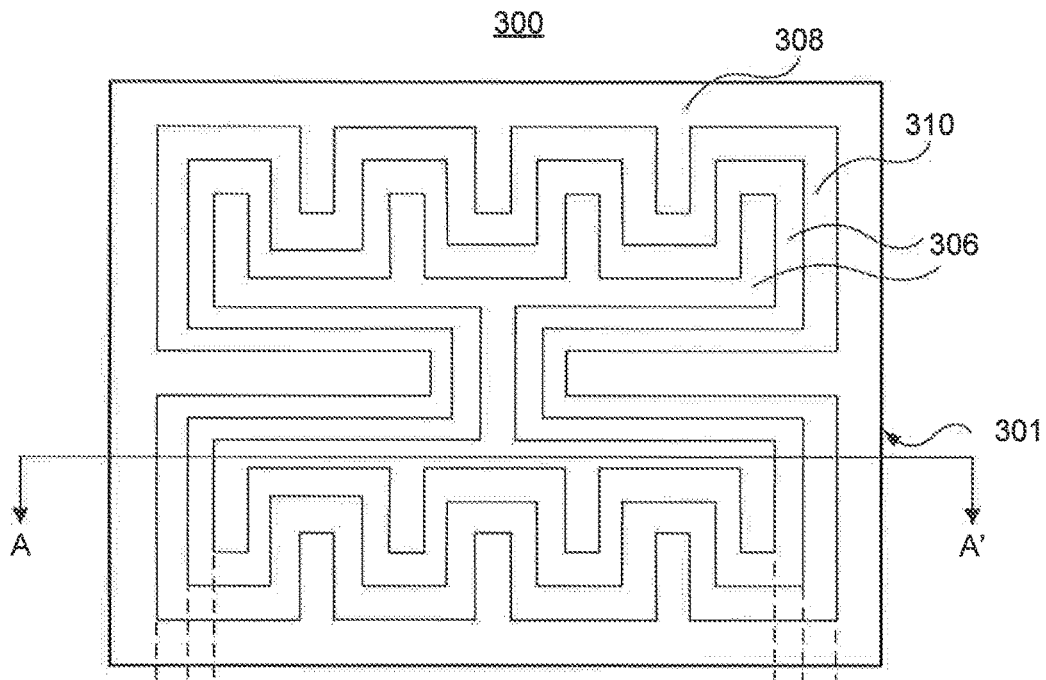
FIG. 3A shows a plan view of an exemplary semiconductor device consistent with some embodiments of this disclosure.
Figure 3B:
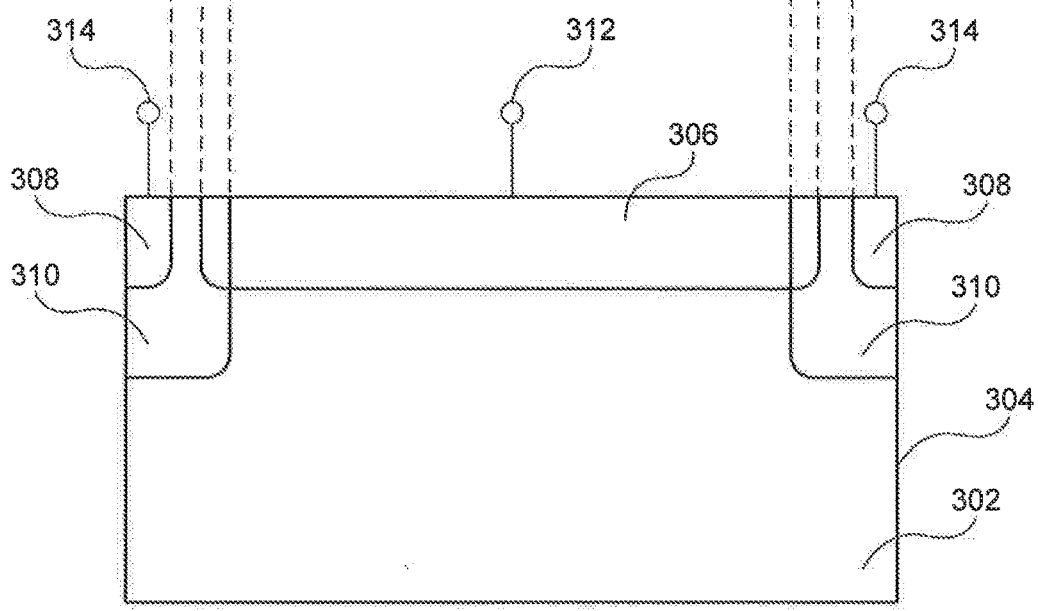
FIG. 3B shows a cross-sectional view along section line AA' in FIG. 3A.

FIG. 3A shows a plan view of a semiconductor device 300 including a Zener diode 301 consistent with embodiments of this disclosure. FIG. 3B shows a cross-sectional view along a section line AA' illustrated in Hg. 3A. Referring to FIGS. 3A and 3B, Zener diode 301 is formed in a first-conductivity-type well region 302 formed by doping a semiconductor substrate 304 with a first-conductivity-type dopant. Zener diode 301 includes a first impurity region 306 doped with a second-conductivity-type dopant, at least one second impurity region 308 doped with a first-conductivity-type dopant, and at least one base region (third impurity region) 310 doped with a first-conductivity-type dopant. The first-conductivity type is opposite to the second-conductivity type. Semiconductor substrate 304 may be, for example, a p-type or n-type silicon substrate. In some embodiments, second impurity region 308 is disposed within base region 310 and has a depth shallower than that of base region 310. First impurity region 306 is disposed in well region 302 and has a depth shallower than that of base region 310. A portion of first impurity region 306 overlaps base region 310. A first electrode 312 of diode 301 is coupled to first impurity region 306, and at least one second electrode 314 is coupled to second impurity region 308. Consistent with an exemplary embodiment, FIG. 3B shows two second impurity regions 308 embedded in two base regions 310, and each of base regions 310 partially overlaps with first impurity region 306.

Figure 3C:
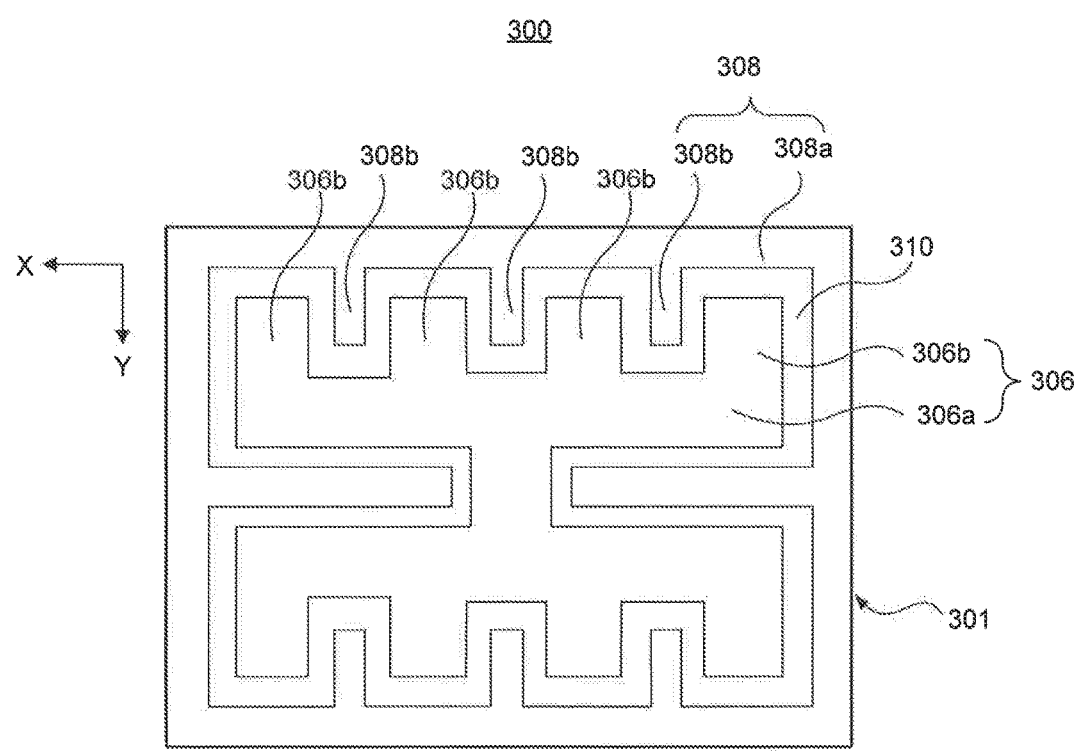
FIG. 3C shows a plan view of an exemplary semiconductor device consistent with some embodiments of this disclosure.

FIG. 3C shows a portion of Zener diode 301, in which base region 310 is not shown for clarity. Referring to FIG. 3C, first impurity region 306 includes first branch 306a extending in a first direction, e.g., the x direction, and at least one second branch 306b (four branches are shown) extending from first branch 306a in a second direction, e.g., the y direction, which is different from the first direction. Second impurity region 308 includes third branch 308a extending in a third direction, e.g., substantially in the x direction, and at least one fourth branch 308b (three branches are shown) extending from third branch 308a in a fourth direction, e.g., substantially in the y direction, which is different from the third direction. Second branch 306b of first impurity region 306 and fourth branch 308b of second impurity region 308 are disposed to interlace with each other. First impurity region 306 and second impurity region 308 are separated by base region 310. Although specific numbers of branches are illustrated in FIG. 3C, the numbers are not limited and can be more or less than those illustrated. In the illustrated embodiment, the x and y directions are mutually orthogonal.

Still referring to FIG. 3C, first impurity region 306 has a shape of a comb/fork having second branches 306b extended along the y direction to point toward third branch 308a of second impurity region 308. Second impurity region 308 also has a shape of a comb/fork having fourth branches 308b extending along the y direction to point toward first branch 306a of first impurity region. A free end of each of second branches 306b of first impurity region 306 is disposed adjacent to third branch 308a of second impurity region 308. A free end of fourth branches 308b of second impurity region 308 is disposed adjacent to first branch 306a of first impurity region 306. As shown in FIG. 3C, at least one second branch 306b is disposed between a pair of fourth branches 308b, and at least one fourth branch 308b is disposed between a pair of second branches 306b. As compared to a conventional Zener diode having the same area, the layout of impurity regions shown in FIGS. 3A and 3C increases the junction area, e.g., the interface between first impurity region 306 and base region 310, by about 90%, which increases the current flow of the Zener breakdown.

In some embodiments, the first-conductivity type is n-type and the second-conductivity type is p-type, or vice versa. For example, in an n-type base Zener diode, well region 302 is n-type; first impurity region 306 is a p+ region having a doping concentration of $10^{16}$ to $10^{20}$ atoms/cm$^3$; second impurity region 308 is an n+ region having a doping concentration of $10^{18}$ to $10^{20}$ atoms/cm$^3$; and base region 310 is an n region having a doping concentration of $10^{16}$ to $10^{19}$ atoms/cm$^3$, provided that second impurity region 308 has a higher doping concentration than that of base region 310. The doping concentration of base region 310 depends on a desired Zener breakdown voltage. More specifically, the doping concentrations of base (third impurity) region 310 and first impurity region 306 are tuning parameters to achieve a desired Zener breakdown voltage. The doping concentration of second impurity region 308 is greater than that of well region 302. In a p-type base Zener diode, well region 302 is p-type; first impurity region 306 is an n+ region having a doping concentration of $10^{18}$ to $10^{20}$ atoms/cm$^3$; second impurity region 308 is a p+ region having a doping concentration of $10^{18}$ to $10^{20}$ atoms/cm$^3$; and base region 310 is a p region having a doping concentration of $10^{16}$ to $10^{19}$ atoms/cm$^3$. In some embodiments, the n-type dopant can be phosphorus or arsenic, and the p-type dopant can be boron.

Figure 4A:
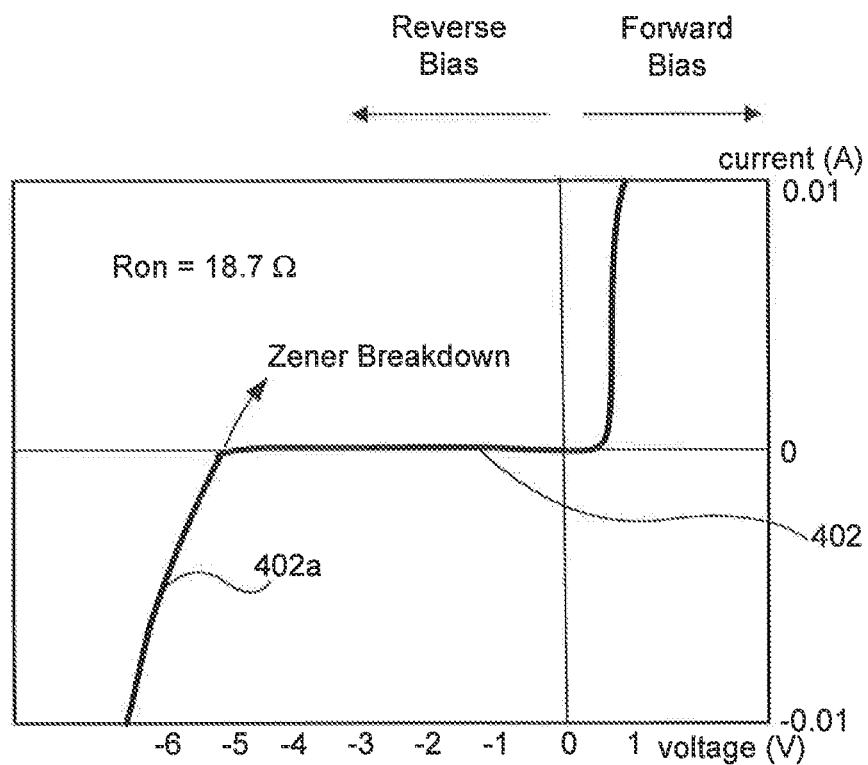
FIG. 4A is a current-voltage curve showing measuring results of a conventional Zener diode.
Figure 4B:
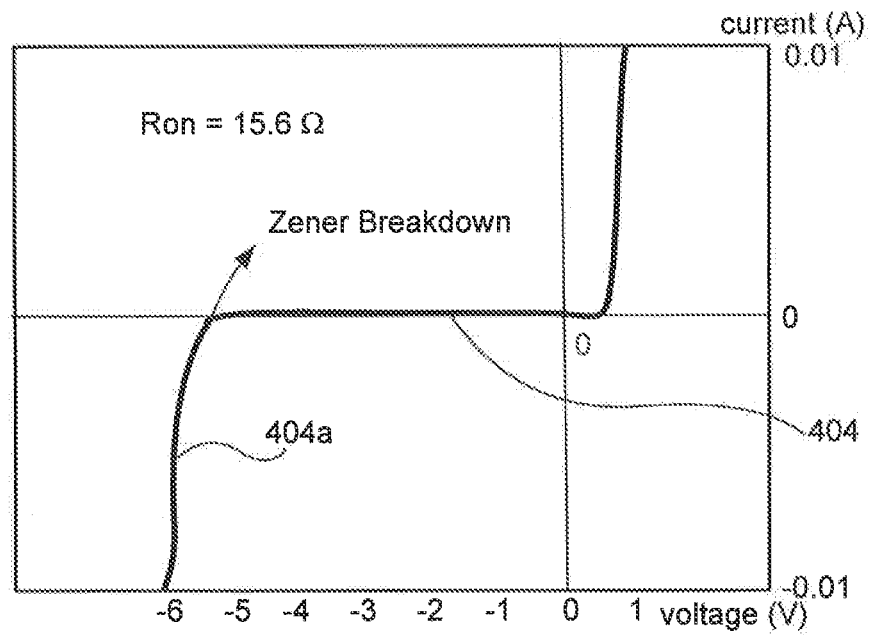
FIG. 4B is a current-voltage curve showing measuring results of an exemplary Zener diode consistent with some embodiments of this disclosure.

FIGS. 4A and 4B are exemplary current-voltage (I-V) characteristics measured in actual devices, in which curves 402 and 404 are of a conventional Zener diode and an n-type base Zener diode consistent with the embodiments of this disclosure, respectively. In FIGS. 4A and 4B, the abscissa represents voltage and the ordinate represents current. I-V curves 402 and 404 include Zener breakdown regions 402a and 404a, respectively, after the Zener breakdown when reverse biased. The Zener breakdown regions 402a and 404a of curves 402 and 404 have slopes, which are inversely proportional to the resistance Ron of the diodes. As shown in FIGS. 4A and 4B, the resistance Ron of the conventional Zener diode is 18.7Ω, while the resistance Ron of the Zener diode consistent with the embodiments of this disclosure is 15.6Ω. The smaller resistance indicates that the Zener diode consistent with the embodiments of this disclosure has a faster switching speed than that of the conventional diode.

Figure 5A:
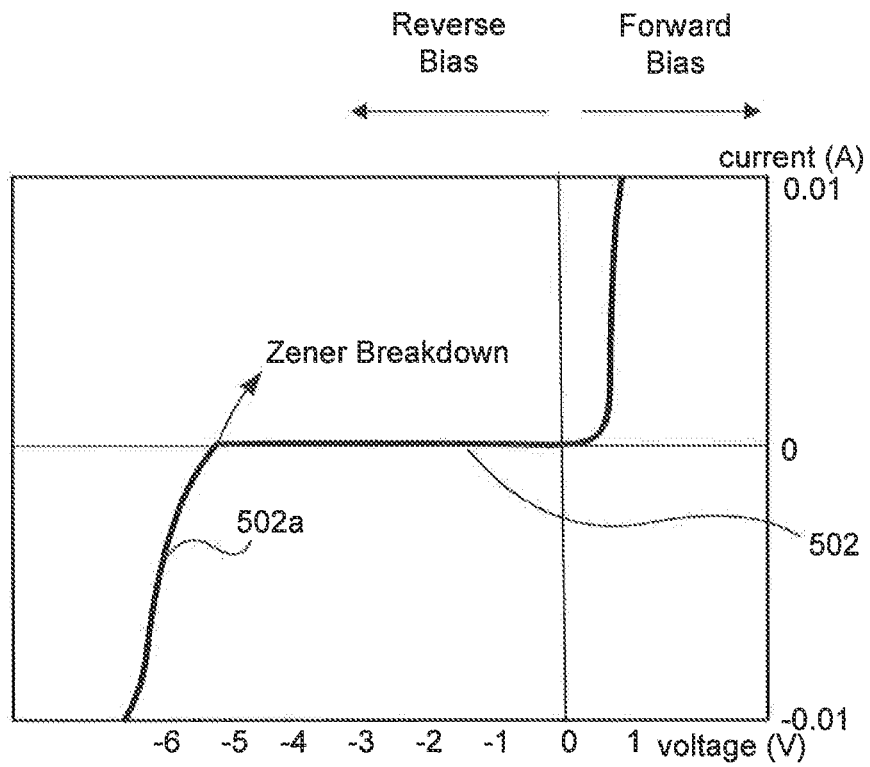
FIG. 5A is a current-voltage curve showing measuring results of a conventional Zener diode.
Figure 5B:
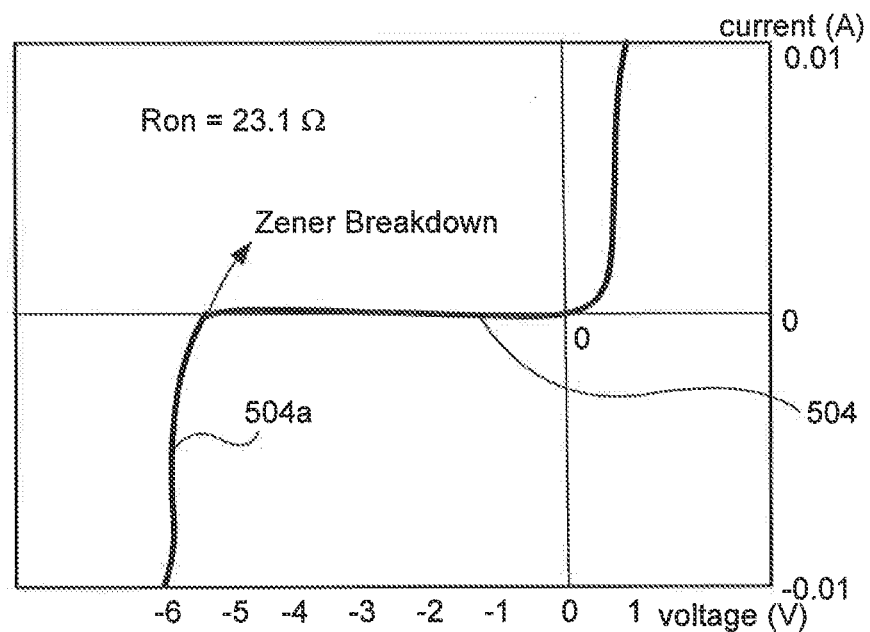
FIG. 5B is a current-voltage curve showing measuring results of an exemplary Zener diode consistent with some embodiments of this disclosure.

FIGS. 5A and 5B are exemplary I-V characteristics measured in actual devices, in which curves 502 and 504 of a conventional Zener diode and a p-type base Zener diode consistent with the embodiments of this disclosure, respectively. In FIGS. 5A and 5B, the abscissa represents voltage and the ordinate represents current. I-V curves 502 and 504 include Zener breakdown regions 502a and 504a, respectively, after the Zener breakdown when reverse biased. While a slope of the Zener breakdown region 504a can be obtained, no slope can be extracted from curve 502 in the Zener breakdown region 502a because region 502a can only be approximated by a quadratic equation, which indicates that its switching speed is slower. The resistance Ron of the Zener diode in FIG. 5B is about 23.1Ω.

Figure 6A:
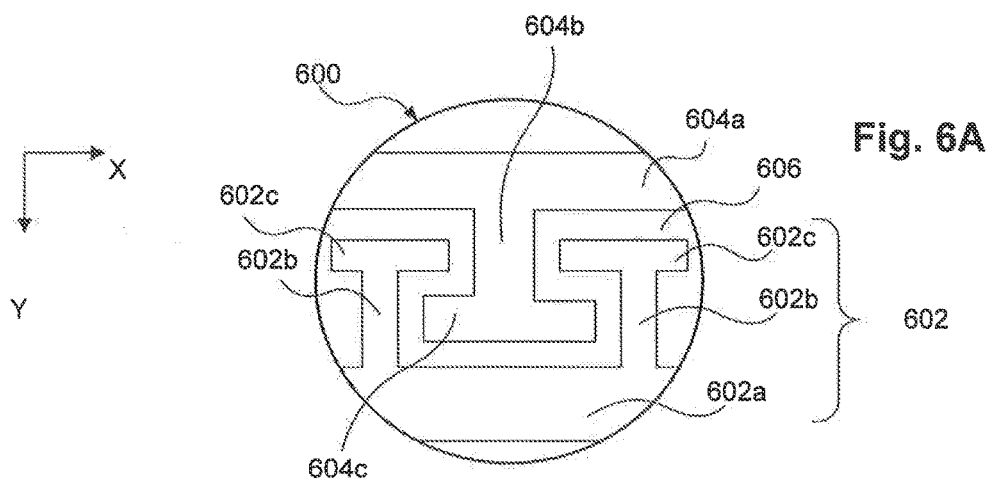
FIGS. 6A-6C show plan views of exemplary Zener diodes consistent with some embodiments of this disclosure.

Although branches 306a, 306b, 308a, 308b are shown in FIG. 3C having a rectangular shape, the present disclosure is not so limited. The shapes of the branches can be circular, triangular, polygonal, etc. For example, FIG. 6A illustrates a portion of a Zener diode 600 including a first branch 602a extending in the x direction, a second branch 602b extending from first branch 602a and in the y direction, and a third branch 602c extending from second branch 602b and in x direction. Branches 602a, 602b, and 602c are part of a first impurity region 602. Zener diode 600 further includes a fourth branch 604a extending the x direction, a fifth branch 604b extending from fourth branch 604a and in the y direction, and a sixth branch 604c extending from fifth branch 604b and in the x direction. Branches 604a, 604b, and 604c are part of a second impurity region (not shown). Branches 602a, 602b, and 602c of first impurity region 602 and branches 604a, 604b, and 604c of the second impurity region are separated by a base region (third impurity region) 606. Branches 602a, 602b, and 602c of first impurity region 602 and branches 604a, 604b, and 604c of the second impurity region interlace with each other to increase a current flow between the first and second impurity regions.

Figure 6B:
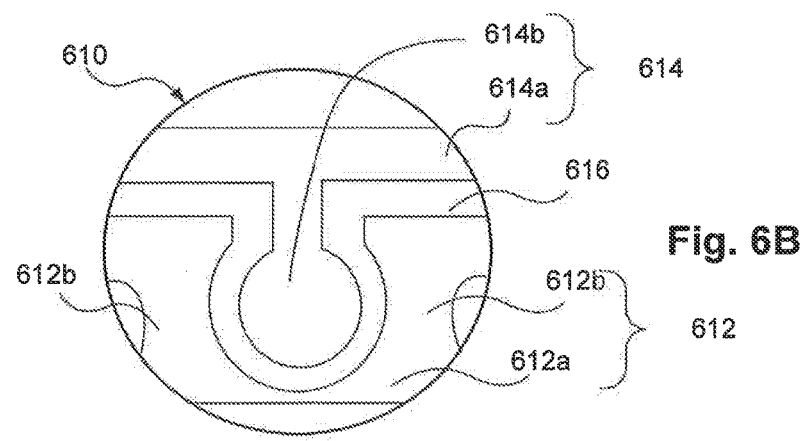

FIG. 6B shows a portion of a Zener diode 610 consistent with the embodiments of this disclosure. Zener diode 610 includes a first impurity region 612 having branches 612a and 612b, and a second impurity region 614 having branches 614a and 614b. Branch 614b has a circular shape at its end portion. Branches 612a and 612b of first impurity region 612 and branches 614a and 614b of second impurity region 614 are separated by a base region (third impurity region) 616.

Figure 6C:
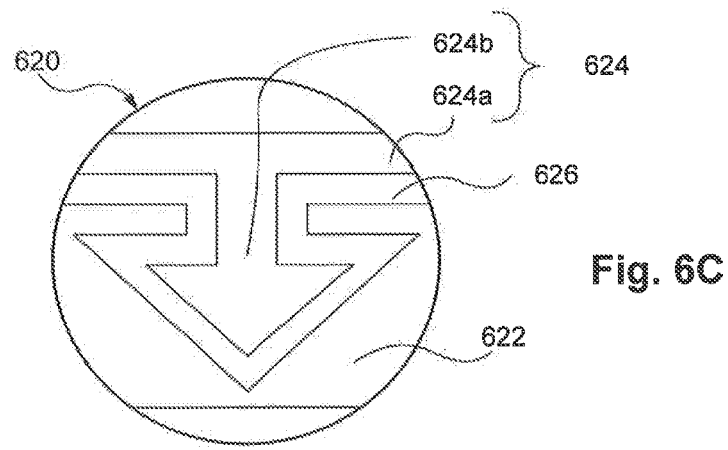

FIG. 6C shows a portion of a Zener diode 620 consistent with the embodiments of this disclosure. Zener diode 620 includes a first impurity region 622 and a second impurity region 624 having branches 624a and 624b. Branch 624b has an arrow shape at its end portion. First impurity region 622 and branches 624a and 624b of second impurity region 624 are separated by a base region (third impurity region) 626.

The respective doping concentration ranges of the first, second, and third impurity regions of Zener diodes 600, 610, and 620 are substantially the same as described above for first, second, and third impurity regions of Zener diode 301, provided that the second impurity region has a higher doping concentration than that of the third impurity region.

Figure 7:
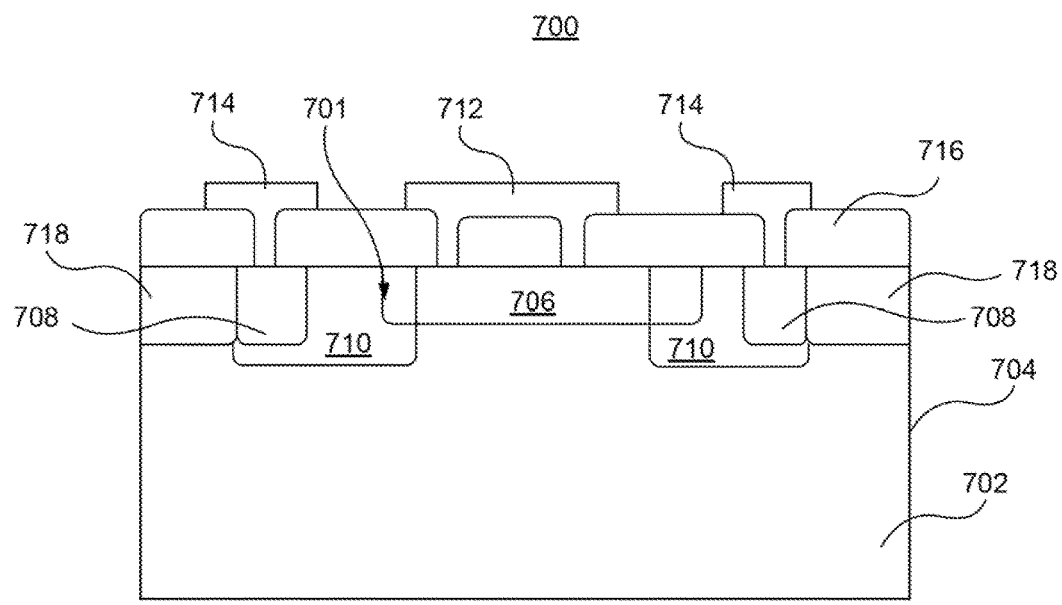
FIG. 7 shows a cross-sectional view of an exemplary semiconductor device consistent with some embodiments of this disclosure.

FIG. 7 shows an exemplary semiconductor device 700 having a Zener diode 701 consistent with embodiments of this disclosure. Zener diode 701 is formed on a first-conductivity-type well region 702 having a first-conductivity-type dopant of a semiconductor substrate 704, and includes a first impurity region 706 having a second-conductivity-type dopant, at least one second impurity region 708 having a first-conductivity-type dopant, and at least one base region (third impurity region) 710 having a first-conductivity-type dopant. The first-conductivity type is opposite to the second-conductivity type. Second impurity region 708 is disposed within base region 710 and has a depth shallower that of base region 710. First impurity region 706 is disposed within well region 702 and has a depth shallower that of base region 710. A portion of first impurity region 706 overlaps base region 710. A first electrode 712 of diode 701 is coupled to first impurity region 706 via a dielectric layer 716, and at least one second electrode 714 is coupled to second impurity region 708 via dielectric layer 716. Dielectric layer 716 may be an oxide, a nitride or a combination thereof. Semiconductor device 700 further includes a field oxide 718 disposed at the circumference of base region 710. In some embodiments, field oxide 718 may be replaced with a shallow trench isolation or other suitable dielectric structures.

Figure 8:
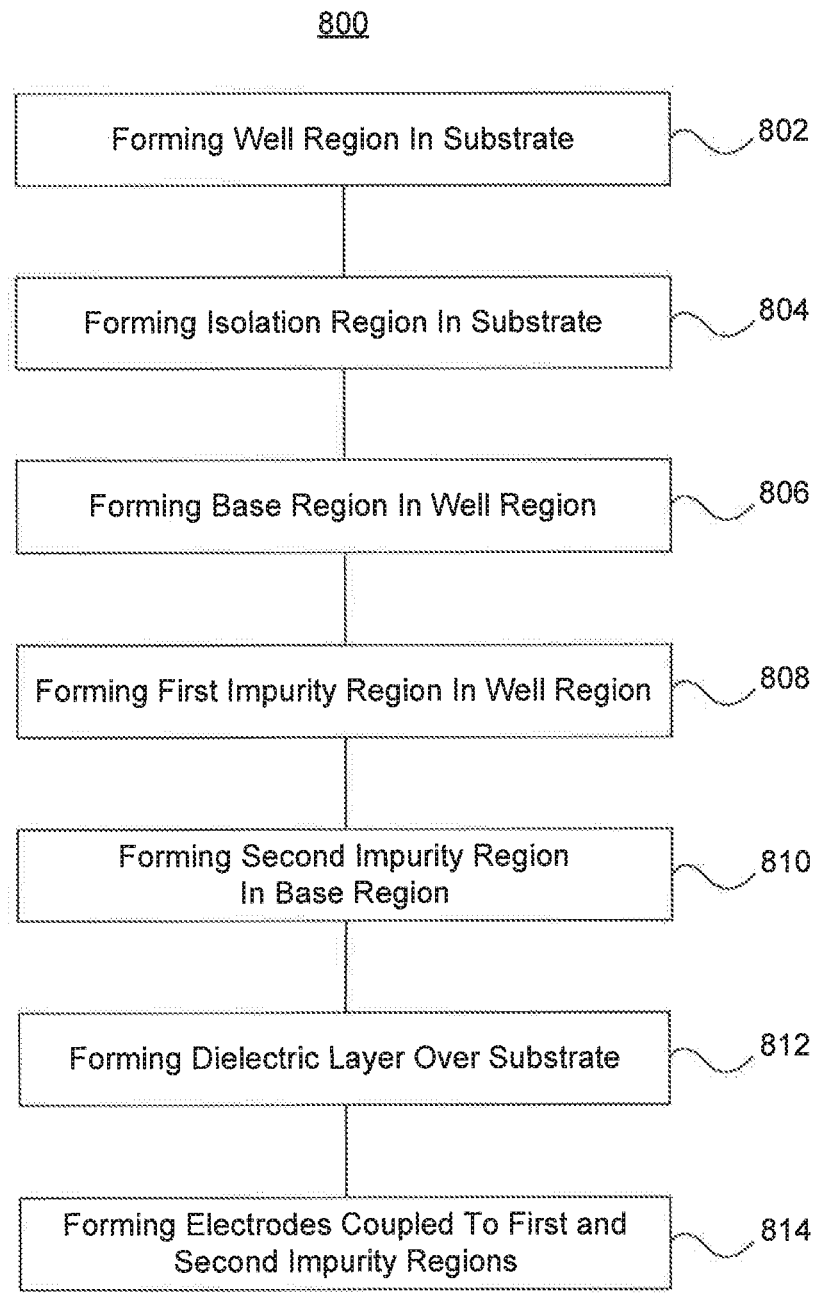
FIG. 8 is a flow chart showing an exemplary method for manufacturing a semiconductor device consistent with some embodiments of this disclosure.

FIG. 8 is a flow chart showing an exemplary method 800 for forming a semiconductor device such as devices 300 (FIGS. 3A-3C) and 700 (FIG. 7), including a Zener diode consistent with embodiments of this disclosure. Referring to FIGS. 3A-3C, 7, and 8, in step 802, a well region of a first-conductivity type, such as region 302 or 702, is formed in a semiconductor substrate. The well region may be formed by ion implantation. In step 804, an isolation region, such as field oxide 718 is formed in the substrate. In step 806, a base region (third impurity region) of the first-conductivity type, such as region 310 or 710, is formed in the well region and adjacent to the isolation region. In step 808, a first impurity region of a second-conductivity type, such as region 306 or 706, having a plurality of branches, is formed in the well region. The branches of the first impurity region are formed to partially overlap the base region. In step 810, a second impurity region of the first-conductivity type, such as region 308 or 708, having a plurality of branches is formed in the base region. The branches of the second impurity region are formed to separate from and interlace with the branches of the first impurity region as illustrated in FIGS. 3C, 6A, 6B, and 6C. At least one branch of the first impurity region is formed to interpose between a pair of second-impurity-region branches, and at least one branch of the second impurity region is formed to interpose between a pair of first-impurity-region branches. The base region, the first impurity region, and the second impurity region may be formed by ion implantation as well.

Still referring to FIGS. 7 and 8, in some embodiments, method 800 further includes steps 812 and 814. In step 812, a dielectric layer, such as layer 716, is formed over the substrate. In step 814, electrodes, such as electrodes 712, 714, are formed to couple to each of the first impurity region and the second impurity region via through holes in the dielectric layer.

In some embodiments, one or more of the steps shown in FIG. 8 may be omitted and their sequence may be modified.

The Zener diodes illustrated in this disclosure can be implemented in a voltage regulator, voltage shifter or waveform clipper, transient voltage suppressor, or any other circuit that uses a Zener diode.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising:
   a substrate;
   a well region of a first-conductivity type, disposed in the substrate;
   a first impurity region of a second-conductivity type, the first impurity region having a plurality of branches disposed in the well region, the second-conductivity type being opposite to the first-conductivity type;
   a second impurity region of the first-conductivity type, the second impurity region having a plurality of branches; and
   a third impurity region of the first-conductivity type disposed in the well region, a portion of the first impurity region overlapping a first portion of the third impurity region, the plurality of branches of the second impurity region being disposed in the third impurity region, and a second portion of the third impurity region being disposed between the first impurity region and the second impurity region.

2. The semiconductor device according to claim 1, wherein at least one portion of the plurality of branches of the first impurity region interlaces with at least one portion of the plurality of branches of the second impurity region.

3. The semiconductor device according to claim 1, wherein the plurality of branches of the first impurity region includes a first branch extending in a first direction and second branches extending from the first branch in a second direction different from the first direction.

4. The semiconductor device according to claim 3, wherein the plurality of branches of the first impurity region further includes third branches extending from the second branches in the first direction.

5. The semiconductor device according to claim 3, wherein the plurality of branches of the second impurity region includes a third branch extending in a third direction different from the second direction, free ends of the second branches being disposed toward the third branch.

6. The semiconductor device according to claim 5, wherein the plurality of branches of the second impurity region further includes fourth branches extending from the third branch in a fourth direction, free ends of the fourth branches being disposed toward the first branch.

7. The semiconductor device according to claim 6, wherein at least one of the second branches is disposed between a pair of the fourth branches, and at least one of the fourth branches is disposed between a pair of the second branches.

8. The semiconductor device according to claim 6, wherein the plurality of branches of the second impurity region further includes fifth branches extending from the fourth branches in the third direction.

9. The semiconductor device according to claim 5, wherein the free end of each of the second branches has a circular or polygonal shape.

10. The semiconductor device according to claim 1, further comprising:
    a dielectric layer disposed on the substrate;
    a first electrode coupled to the first impurity region via the dielectric layer; and
    a second electrode coupled to the second impurity region via the dielectric layer.

11. The semiconductor device according to claim 1, further comprising an isolation region disposed at a periphery of the third impurity region.

12. The semiconductor device according to claim 1, wherein the second impurity region has a doping concentration greater than a doping concentration of the third impurity region.

13. A semiconductor device comprising:
    a substrate;
    a well region of a first-conductivity type, disposed in the substrate;
    a first impurity region of a second-conductivity type, the first impurity region having a first branch extending in a first direction and a plurality of second branches extending in a second direction and connected to the first branch, the second-conductivity type being opposite to the first-conductivity type;
    a second impurity region of the first-conductivity type, the second impurity region having a third branch extending substantially in the first direction and a plurality of fourth branches extending substantially in the second direction and connected with the third branch; and
    a third impurity region of the first-conductivity type disposed in the well region, a portion of the first impurity region overlapping a first portion of the third impurity region, the second impurity region being disposed in the third impurity region, and a second portion of the third impurity region being disposed between the first impurity region and the second impurity region.

14. The semiconductor device according to claim 13, wherein at least one portion of the plurality of second branches of the first impurity region interlaces with at least one portion of the plurality of fourth branches of the second impurity region.

15. The semiconductor device according to claim 13, wherein free ends of the second branches are disposed toward the third branch.

16. The semiconductor device according to claim 13, wherein free ends of the fourth branches are disposed toward the first branch.

17. The semiconductor device according to claim 13, wherein at least one of the second branches is disposed between a pair of the fourth branches, and at least one of the fourth branches is disposed between a pair of the second branches.

18. A method for manufacturing a semiconductor device, comprising:
    forming a well region of the first-conductivity type in a substrate;
    forming a third impurity region of the first-conductivity type in the well region;
    forming a first impurity region of a second-conductivity type in the well region, the first impurity region having a plurality of branches, the second-conductivity type being opposite to the first-conductivity type, a portion of the first impurity region being formed to overlap a first portion of the third impurity region; and
    forming a second impurity region of the first-conductivity type in the third impurity region, the second impurity region having a plurality of branches, a second portion of the third impurity region being disposed between the first impurity region and the second impurity region.

\* \* \* \* \*